United States Patent [19]

Tanaka et al.

[11] 4,292,107
[45] Sep. 29, 1981

[54] PROCESS FOR MANUFACTURING A RADIOGRAPHIC INTENSIFYING SCREEN

[75] Inventors: Michio Tanaka, Fujisawa; Norio Miura, Isehara; Keiji Shimiya, Hiratsuka, all of Japan

[73] Assignee: Kasei Optonix, Ltd., Tokyo, Japan

[21] Appl. No.: 9,842

[22] Filed: Feb. 6, 1979

[30] Foreign Application Priority Data

Feb. 10, 1978 [JP] Japan ................................. 53-14305

[51] Int. Cl.³ ............................................ B32B 31/00
[52] U.S. Cl. .................................. 156/249; 156/272; 252/301.36; 427/54.1; 427/64; 427/68; 427/71; 427/157; 428/913
[58] Field of Search ....................... 427/64, 54, 68, 67, 427/71, 52, 54.1, 52, 157; 428/913; 156/272, 247, 249; 252/301.36

[56] References Cited

U.S. PATENT DOCUMENTS

| | | | |
|---|---|---|---|
| 3,095,317 | 6/1963 | Saffire | 427/54 |
| 3,617,285 | 11/1971 | Staudenmayer | 252/301.36 X |
| 3,712,827 | 1/1973 | Gramza | 252/301.36 X |
| 3,787,238 | 1/1974 | Juliano | 252/301.36 X |
| 3,839,069 | 10/1974 | Linturn | 427/157 |
| 4,070,498 | 1/1978 | Nishizawa et al. | 427/54 X |
| 4,110,187 | 8/1978 | Sloan et al. | 427/54 X |
| 4,113,894 | 9/1978 | Koch | 156/249 X |
| 4,139,436 | 2/1979 | Jasani | 427/54 X |
| 4,148,987 | 4/1979 | Winey | 427/54 X |
| 4,163,809 | 8/1979 | McGinniss et al. | 427/54 X |
| 4,164,459 | 8/1979 | Noomen | 427/54X |
| 4,165,396 | 8/1979 | Calamari | 427/64 |
| 4,188,449 | 2/1980 | Lu et al. | 427/54.1 X |
| 4,203,816 | 5/1980 | Vargio et al. | 427/54.1 |

*Primary Examiner*—William R. Dixon, Jr.
*Attorney, Agent, or Firm*—Gerald J. Ferguson, Jr.; Joseph J. Baker

[57] ABSTRACT

An intensifying screen having high physical durability and chemical resistance in which a curable resin is used as a resinous binder of a radioluminescent phosphor can easily be manufactured by employing an ultraviolet radiation-curable resin composition as the resinous binder. A dispersion comprising the ultraviolet radiation-curable resin composition and the radioluminescent phosphor dispersed in the composition is applied to the surface of a support to form a coating on the support, and the coating is cured by exposure to ultraviolet radiation to form a fluorescent layer on the support.

42 Claims, No Drawings

PROCESS FOR MANUFACTURING A RADIOGRAPHIC INTENSIFYING SCREEN

BACKGROUND OF THE INVENTION

1. Field of the Invention

This invention relates to a process for manufacturing a radiographic intensifying screen (hereinafter referred to as "intensifying screen").

2. Description of the Prior Art

Radiography is generally classified into two types, viz., medical radiography used for medical diagnosis and industrial radiography used for nondestructive inspection of industrial materials. In both types, the intensifying screen is used in face contact with a radiographic film to increase the sensitivity of the radiographing system. The intensifying screen is essentially composed of a support and a fluorescent layer formed thereon. The fluorescent layer is composed of a phosphor which emits light of high luminance by the excitation of radiation (hereinafter referred to as "radioluminescent phosphor") dispersed in a resinous binder. The fluorescent layer is usually covered with a transparent protective layer. Some intensifying screens have a reflective layer or an absorptive layer between the support and the fluorescent layer. Further, some intensifying screens used for nondestructive inspection of industrial materials have a metallic foil between the support and the fluorescent layer.

The intensifying screen having the above-mentioned structure has been manufactured heretofore by the following manufacturing process. That is, a radioluminescent phosphor is mixed with a proper amount of non-curable or thermoplastic resinous binder such as derivatives of cellulose (cellulose acetate butyrate, cellulose triacetate, cellulose nitrate, etc.), vinyl chloride-vinyl acetate copolymer, vinyl chloride-vinylidene chloride copolymer, vinyl chloride-acrylonitrile copolymer, vinylidene chloride-acrylonitrile copolymer, polyvinyl butyral, polyamide resin, butadiene-acrylonitril copolymer, styrene-butadiene copolymer, polyester resin, urethane resin or the like. Then, a proper amount of solvent is added to the mixture to prepare a dispersion having the optimum viscosity. Additives such as a dispersing agent for improving the dispersibility of the radioluminescent phosphor, and a plasticizer such as dibutyl phthalate, methylphthalyl ethyleneglycol or the like for increasing the plasticity of the intensifying screen obtained may be added to the coating dispersion. The dispersion thus prepared is applied to a support by means of a roll coater, a knife coater or the like to form a coating, and the coating is dried to form a fluorescent layer. When the intensifying screen having a reflective layer, an absorptive layer or a metallic foil between a support and a fluorescent layer is manufactured, the reflective layer, the absorptive layer or the metallic foil is provided on the support beforehand, and then the fluorescent layer is formed thereon in the same manner as described above. In this specification, unless otherwise indicated, the expression "support" means a support on which a reflective layer, a absorptive layer or a metallic foil is provided beforehand, as well as a sole support. After the formation of the fluorescent layer, a transparent protective layer is usually provided on the fluorescent layer.

As described above, in the conventional intensifying screen, a thermoplastic resin is used as a resinous binder. Recently, the intensifying screen has been required to have high degree of physical durability and chemical resistance with increase of use thereof owing to, for example, the advance in high speed serial radiography. Therefore, it has been attempted to use a curable resin which is superior in both the physical durability and the chemical resistance to the thermoplastic resin as a resinous binder of the intensifying screen instead of the thermoplastic resin. As the curable resins the practical use of which has been tested heretofore are known as two-pack resin composition and a heat-curable resin. However, when the two-pack resin composition or the heat-curable resin is used as a resinous binder, it is difficult to manufacture the intensifying screen exhibiting high radiographic image quality (hereinafter referred to as "image quality"). That is, when the two-pack resin composition is used, a dispersion having high dispersibility of the radioluminescent phosphor cannot be obtained, because a curing component or a curing catalyst of the two-pack resin composition should be mixed at the last step of the preparation of the dispersion in a short period of time to prevent the dispersion to cure during the preparation thereof. Thus, the intensifying screen exhibiting high image quality cannot be obtained. Further, when the two-pack resin composition is used, the dispersion prepared should be applied to a support as soon as possible, because the curing component or the curing catalyst has already been added thereto. In the dispersion which is left to stand for a long period of time after the preparation thereof, a curing reaction advances and accordingly, the dispersion cannot be applied to the support with high reproducibility. Further, in the dispersion which is left to stand for a still longer period of time, a gelation occurs and accordingly, the dispersion cannot be applied to the support at all. As described above, when the two-pack resin composition is used as a resinous binder, there are defects that a large quantity of dispersion cannot be prepared at a time and that a coating prepared cannot be applied to a support with high reproducibility, as well as the defect that the intensifying screen exhibiting high image quality cannot be obtained.

On the other hand, when the heat-curable resin is used as a resinous binder, the radioluminescent phosphor particles by a convection occurs in the dispersion applied to a support during the curing thereof by heating and accordingly, the dispersibility of the radioluminescent phosphor in the fluorescent layer formed is deteriorated. Thus, the intensifying screen exhibiting high image quality cannot be obtained. Further, when the heat-curable resin is used as a resinous binder, a large-scale heating apparatus for curing is required. For the above-mentioned reasons, it has been difficult heretofore to use a curable resin as a resinous binder of the intensifying screen.

SUMMARY OF THE INVENTION

An object of the present invention is to provide a process for manufacturing an itensifying screen whereby an intensifying screen having a high physical durability and chemical resistance in which a curable resin is used as a resinous binder of a radioluminescent phosphor can easily be manufactured without deteriorating the image quality thereof.

In order to attain the aforesaid object, the inventors conducted various investigations in the process for manufacturing the intensifying screen in which a curable resin was used as a resinous binder. As the result of the investigations, it was found that when an ultraviolet radiation-curable resin composition was used as a resinous binder, the aforesaid object could be attained. That is, it was found that when a radioluminescent phosphor was dispersed in an ultraviolet radiation-curable resin composition to prepare a dispersion, then the dispersion thus prepared was applied to the surface of a support to form a coating on the support and thereafter the coating was cured by exposure to ultraviolet radiation to form a fluorescent layer on the support, an itensifying screen having high physical durability and chemical resistance and exhibiting high image quality could be obtained. The occurrence of the curing of the coating by the exposure to ultraviolet radiation was an entirely unexpected result. This is because when an inorganic pigment is dispersed in an ultraviolet radiation-curable resin composition to prepare a dispersion, the dispersion obtained cannot be cured sufficiently by exposure thereof to ultraviolet radiation becuse of the absorption of the ultraviolet radiation by the inorganic pigment dispersed therein and accordingly, the ultraviolet radiation-curable resin composition has heretofore been used only as a clear lacquer.

One of the processes for manufacturing an intensifying screen of the present invention comprises the steps of applying to the surface of a support a dispersion comprising an ultraviolet radiation-curable resin composition which is composed of an unsaturated resin, a polymerizable monomer and a sensitizer, and a radioluminescent phosphor dispersed in the ultraviolet radiation-curable resin composition to form a coating on the support, and curing the coating by exposing the coating to ultraviolet radiation to form a fluorescent layer on the support.

Another process for manufacturing an intensifying screen of the present invention comprises steps of applying to a support a dispersion comprising a first ultraviolet radiation-curable resin composition which is composed of a first unsaturated resin, a first polymerizable monomer and a first sensitizer, and a radioluminescent phosphor dispersed in the first ultraviolet radiation-curable resin composition to form a first coating on the support, curing the first coating by exposing the first coating to first ultraviolet radiation to form a fluorescent layer on the support, applying to the surface of the fluorescent layer a second ultraviolet radiation-curable resin composition which is composed of a second unsaturated resin, a second polymerizable monomer and a second sensitizer to form a second coating on the fluorescent layer, and curing the second coating by exposing the second coating to second ultraviolet radiation to form a transparent protective layer.

The other process for manufacturing an intensifying screen of the present invention comprises steps of applying to the surface of a flat plate a dispersion comprising an ultraviolet radiation-curable resin composition which is composed of an unsaturated resin, a polymerizable monomer and a sensitizer, and a radioluminescent phosphor dispersed in the ultraviolet radiation-curable resin composition to form a coating on the flat plate, curing the coating by exposing the coating to ultraviolet radiation to form a fluorescent layer on the flat plate, peeling off the fluorescent layer from the flat plate and bonding the fluorescent layer peeled off to the surface of a support.

In accordance with the manufacturing process of the present invention, an intensifying screen having high physical durability and chemical resistance in which a curable resin is used as a resinous binder of a radioluminescent phosphor can easily be manufactured without deteriorating the image quality thereof. Further, the manufacturing process of the present invention has the following advantages even in comparison with the manufacturing process of the itensifying screen in whih a thermoplastic resin is used as a resinous binder of a radioluminescent phosphor. That is, in the manufacturing process of the present invention, a large amount of solvent is not used and accordingly, there is no hazard of inflammation and environment pollution. Also, in the manufacturing process of the present invention, the curing is performed in a short period of time (several seconds) and accordingly, a long period of drying time is not required.

DETAILED DESCRIPTION OF THE INVENTION

The manufacturing process of the present invention will hereinafter be described in detail.

The ultraviolet radiation-curable resin composition employed as a curable resin in the manufacturing process of the present invention is composed of an unsaturated resin, a polymerizable monomer and a sensitizer. As the unsaturated resin, polyester acrylate, urethane polyester acrylate, polyester methacrylate, epoxy acrylate, polyether acrylate and the like can be employed. The polymerizable monomer has two functions in the ultraviolet radiation-curable resin composition. Firstly, the polymerizable monomer acts as a crosslinking agent of the unsaturated resin. Secondly, the polymerizable monomer acts as a diluent of the unsaturated resin which is very viscous. The polymerizable monomer is classified into two types, viz., monofunctional monomer having one reactive group and polyfunctional monomer having more than one reactive group. Both the monofunctional monomer and the polyfunctional monomer can be employed in this invention. As a monofunctional monomer, styrene, methyl methacrylate, vinyltoluene, α-methylstyrene, vinyl acetate, acrylic acid, acrylic esters of monohydroxy alcohol (2-hydroxyethyl acrylate, tetrahydrofurfuryl acrylate, etc.), methacrylic acid, methacrylic esters of monohydroxy alcohol and the like can be employed. As a polyfunctional monomer, divinylbenzene, acrylic esters of polyhydroxy alcohol (diethylene glycol diacrylate, neopentyl glycol diacrylate, 1,6-hexadiol diacrylate, trimethylolpropane triacrylate, pentaerythritol triacrylate, etc.), methacrylic esters of polyhydroxy alcohol and the like can be employed. The sensitizer absorbs ultraviolet radiation and becomes active, and the active sensitizer initiates and promotes the crosslinking reaction between the unsaturated resin and the polymerizable monomer. In general, the sensitizer absorbs the light of wavelength ranging from 200 to 500 nm and has an absorption peak in the near ultraviolet region. As a sensitizer, benzoin, derivatives of benzoin (benzoin isobutyl ether, benzoin methyl ether, etc.), benzophenone, derivatives of benzophenone (2,4-dihydroxybenzophenone, 2-hydroxy-4-methoxybenzophenone, etc.), polycyclic aromatic ketones (thioxanthone, chloroxanthone, benzil, etc.) and the like can be employed.

The ultraviolet radiation-curable resin composition is prepared by mixing the unsaturated resin, the polymerizable monomer and the sensitizer in a proper mixing ratio. In general, the mixing weight ratio of the unsaturated resin to the polymerizable monomer is preferably within the range of 1:0.1 to 1:2, more preferably within the range of 1:0.5 to 1:1.5. The amount of the sensitizer is preferably within the range of 0.01 to 10 weight%, more preferably within the range of 0.5 to 5 weight% of the ultraviolet radiation-curable resin composition.

Then, a coating dispersion is prepared by dispersing a radioluminescent phosphor in the above-mentioned ultraviolet radiation-curable resin composition. As a radioluminescent phosphor, can be employed the conventional radioluminescent phospor for itensifying screen such as tungstate phosphors ($CaWO_4$, $MgWO_4$, $CaWO_4$:Pb, etc.), terbium activated rare earth oxysulfide phosphors [$Y_2O_2S$:Tb, $Gd_2O_2S$:Tb, $La_2O_2S$:Tb, $(Y,GD)_2O_2S$:Tb, $(Y, Gd)_2O_2S$:Tb, Tm, etc.], terbium activated rare earth phosphate phosphors ($YPO_4$:Tb, $GdPO_4$:Tb, $LaPO_4$:Tb, etc.), terbium activated rare earth oxyhalide phosphors (LaOBr:Tb, LaOBr:Tb,Tm, LaOCl:Tb, LaOCl:Tb,Tm, GdOBr:Tb, GdOCl:Tb, etc.), thulium activated rare earth oxyhalide phosphors (LaOBr:Tm, LaOCl:Tm, etc.), barium sulfate phosphors [$BaSO_4$:Pb, $BaSO_4$:$Eu^{2+}$, $(Ba,Sr)SO_4$:$Eu^{2+}$, etc.], divalent europium activated alkaline earth metal phosphate phosphors [$Ba_3(PO_4)_2$:$Eu^{2+}$, $(Ba,Sr)_3(PO_4)_2$:$Eu^{2+}$, etc.], divalent europium activated alkaline earth metal fluorohalide phosphors [$BaFCl$:$Eu^{2+}$, $BaFBr$:$Eu^{2+}$, $BaFCl$:$Eu^{2+}$,Tb, $BaFBr$:$Eu^{2+}$,Tb, $BaF_2.BaCl_2.KCl$:$Eu^{2+}$, $BaF_2.BaCl_2.xBaSO_4.KCl$:$Eu^{2+}$, $(Ba,Mg)F_2.BaCl_2.KCl$:$Eu^{2+}$, etc.], iodide phosphors (CsI:Na, CsI:Tl, NaI, KI:Tl, etc.), sulfide phospors [ZnS:Ag, (Zn,Cd)S:Ag, (Zn,Cd)S:Cu, (Zn,Cd)S:Cu,Al, etc.], hafnium phosphate phosphors ($HfP_2O_7$:Cu, etc.) and the like. The conventional radiographic film has a spectral sensitivity for the wavelength ranging from the near ultraviolet to blue (regular type radiographic film) or for the wavelength ranging from ultraviolet to green (ortho type radiographic film). It is needless to say that, when excited by ionizing radiation, the radioluminescent phosphor employed in the present invention exhibits emission within the region of wavelength ranging from the near ultraviolet to blue or within the region of wavelength ranging from the near ultraviolet to green which coincides with the spectral sensitivity of the radiographic film, also, when excited by ultraviolet radiation, the radioluminescent phosphor employed in the present invention exhibits the same emission as that exhibited when excited by ionizing radiation. As hereinafter described in detail, it is very important to the manufacturing process of the present invention that the radioluminescent phosphor employed in the present invention at least exhibit the emission within the region of wavelength shorter than about 500 nm when excited by ultraviolet radiation, as described above.

The radioluminescent phosphor is mixed with and dispersed homogeneously in the ultraviolet radiation-curable resin composition by means of a ball mill or the like. The mixing weight ratio of the ultraviolet radiation-curable resin composition to the radioluminescent phosphor is decided in view of the characteristic of the desired intensifying screen, the kind of the ultraviolet radiation-curable resin composition, the kind of the radioluminescent phosphor and so forth. In general, the mixing weight ratio of the ultraviolet radiation-curable resin composition to the radioluminescent phosphor is preferably within the range of 1:1 to 1:20, more preferably within the range of 3:10 to 1:10. When the viscosity of the dispersion obtained is too high to be applied on a support, a proper amount of solvent is added thereto to obtain a lower viscosity suitable for application. Methyl isobutyl ketone, xylene and the like are employed as the solvent.

Then, the dispersion thus prepared is applied uniformly to the surface of a support by means of a roll coater, a knife coater or the like, and a coating is formed on the support. As a support, paper, polyethylene terephthalate film, polypropylene film, cellulose triacetate film, polyvinyl chloride film, polycarbonate film and the like can be employed. When an intensifying screen having a reflective layer, an absorptive layer or a metallic foil is manufactured, the support on which the reflective layer, the absorptive layer or the metallic foil is provided beforehand is used. It is needless to say that, in such a case, the dispersion is applied to the surface of the reflective layer, the absorptive layer or the metallic foil. When a solvent is used in the dispersion, the coating formed on the support is heated for removal of the solvent before the coating is exposed to ultraviolet radiation. During the heating, the solvent evaporates.

The coating formed on the support is exposed to ultraviolet radiation and cured. In general, the exposure to ultraviolet radiation is performed by exposing the exposed surface (opposite side of the support) of the coating to ultraviolet radiation. When the support is ultraviolet radiation-transmissive, the exposure to ultraviolet radiation can be performed by exposing the back (support side) of the coating to ultraviolet radiation in addition to exposing the exposed surface thereof to ultraviolet radiation. This exposure method is particularly effective in such a case that the thickness of the coating is large. A mercury vapor lamp which is the most popular source of ultraviolet radiation is preferably used as a source of ultraviolet radiation. As described above, the absorption peak of the sensitizer contained in the ultraviolet radiation-curable resin composition exists in the near ultraviolet region. Accordingly, a mercury vapor lamp which emits ultraviolet radiation of 365 nm is more preferable.

By the exposure to ultraviolet radiation, the coating is cured and a fluorescent layer is formed on the support. The curing time depends on the intensity of ultraviolet radiation used, the thickness of the coating and so forth. In general, the curing is performed in a very short period of time. For example, when the commercially available mercury vapor lamp of high output is used and the distance between the mercury vapor lamp and the coating is made to be several ten centimeters, the time required to cure the coating of usual thickness is several seconds. Since the curing of the coating is performed in a very short period of time, separation of the phosphor from the resinous binder does not occur during the curing and accordingly, an uniform fluorescent layer having a high dispersibility of phosphor can be obtained.

Some intensifying screens have two or more fluorescent layers of different kinds of phosphors or of the same kind of phosphors having different mean grain size. Such intensifying screens can be manufactured by the following manufacturing process. That is, at first, a fluorescent layer is formed on a support in accordance with the above-mentioned manufacturing process. Then, the above-mentioned manufacturing process is repeated once or more and thus, one or more fluorescent layers are laminated on the fluorescent layer. This manufacturing process can also be adopted in such a case that fluorescent layers of different kinds of resinous binders are laminated or that a thick fluorescent layer is formed.

In the present invention, when a transparent protective layer is provided on the fluorescent layer formed in accordance with the above-mentioned manufacturing process, an ultraviolet radiation-curable resin composition is applied to the surface of the fluorescent layer to form a coating and the coating is cured by exposure to ultraviolet radiation to form the transparent protective layer. In this case, the ultraviolet radiation-curable resin composition employed may be or may not be the same as that employed in the formation of the fluorescent layer. Similarly to the case of the formation of the fluorescent layer, the mixing weight ratio of the unsaturated resin to the polymerizable monomer of the ultraviolet radiation-curable resin composition employed in the formation of the transparent protective layer is preferably within the range of 1:0.1 to 1:2, more preferably within the range of 1:0.5 to 1:1.5, and the amount of the sensitizer is preferably within the range of 0.01 to 10 weight%, more preferably within the range of 0.5 to 5 weight% of the ultraviolet radiation-curable resin composition. Further, similarly to the case of the formation of the fluorescent layer, a mercury vapor lamp is preferably used as a source of ultraviolet radiation, and a mercury vapor lamp which emits ultraviolet radiation of 365 nm is more preferably used.

In another manufacturing process of the present invention, a dispersion is applied to the surface of a flat plate which is not a support to form a coating and the coating is cured by exposure to ultraviolet radiation to form a fluorescent layer on the flat plate. Thereafter, the fluorescent layer is peeled off from the flat plate and bonded to the surface of a support. Thus, an intensifying screen is manufactured. Glass plate, resin plate, metallic plate and the like are employed as a flat plate. When the flat plate is ultraviolet radiation-transmissive like a glass plate, the exposure thereof to ultraviolet radiation can be performed by exposing the back (flat plate side) of the coating to ultraviolet radiation in addition to exposing the exposed surface (opposite side of the flat plate) thereof to ultraviolet radiation. Accordingly, the process is effective to manufacture an intensifying screen having a thick fluorescent layer when an ultraviolet radiation-transmissive flat plate is employed. The surface of the flat plate may be treated with a release agent to facilitate the peeling off of the fluorescent layer formed thereon.

The ultraviolet radiation-curable resin composition employed in the manufacturing process of the present invention is usually used only as a clear lacquer. This is because when a pigment usually employed in a paint is dispersed in the ultraviolet radiation-curable resin composition to prepare a dispersion, the sensitizer can not be activated sufficiently by exposure to ultraviolet radiation, particularly in the deeper portion of the coating of the dispersion, because of the absorption of ultraviolet radiation by the pigment and accordingly, the coating of the dispersion is not cured completely. As the reason for the complete curing of the coating in the manufacturing process of the present invention, it is presumed that the radioluminescent phosphor contained in the coating emits light when the coating is exposed to ultraviolet radiation, and the emission accelerates the activation of the sensitizer. That is, as described above, the sensitizer absorbs the light of wavelength ranging from 200 to 500 nm and, on the other hand, the radioluminescent phosphor employed in the present invention at least exhibits emission within the region of wavelength shorter than about 500 nm when excited by ultraviolet radiation. Since a part of the region of wavelength of the absorption of the sensitizer and a part of the region of wavelength of the emission of the radioluminescent phosphor overlap (wavelength region ranging from near ultraviolet to 500 nm), the activation of the sensitizer is also accelerated by the emission of the radioluminescent phosphor caused by the ultraviolet radiation absorbed by the phosphor, as well as by the ultraviolet radiation which is not absorbed by the phosphor, whereby, differently from the case wherein the conventional pigment is dispersed in the ultraviolet radiation-curable resin composition, the coating is completely cured.

In accordance with the manufacturing process of the present invention, an intensifying screen having high physical durability and chemical resistance in which a curable resin is used as a resinous binder of a radioluminescent phosphor can easily be manufactured. Further, in accordance with the manufacturing process of the present invention, an intensifying screen having high dispersibility of a radioluminescent phosphor and accordingly, exhibiting high image quality (sharpness and granularity) can be obtained, because, in the manufacturing process of the present invention, a fluorescent layer is formed in a very short period of time without heating the coating as required in the manufacturing process wherein a heat-curable resin is used as a resinous binder. Moreover, the manufacturing process of the present invention has the following advantages even in comparison with the manufacturing process wherein a thermoplastic resin is used as a resinous binder. That is, in the manufacturing process of the present invention, a large amount of solvent is not used and accordingly, there is no hazard of inflammation and environment pollution. Also, in the manufacturing process of the present invention, the curing is performed in a short period of time and accordingly, a long period of drying step is not required.

The present invention will hereinbelow be described referring to several examples.

EXAMPLE 1

| | |
|---|---|
| Epoxy acrylate (DICLITE UE-8100, manufactured by Dai Nippon Ink Co., Ltd.) | 70 parts (by weight) |
| Trimethylolpropane triacrylate (manufactured by Nippon Kayaku Co., Ltd.) | 80 parts |
| Benzoin methyl ether | 3 parts |
| CaWO$_4$ phosphor | 300 parts |

The above raw materials were mixed for 24 hours by means of a ball mill, and the mixture obtained was filtrated through a filter fabric of 100 mesh to obtain a dispersion. Then, the dispersion thus prepared was applied to the surface of a 250µ thick polyethylene terephthalate film by means of a knife coater to form a coating having a thickness to produce a 150µ thick cured layer (fluorescent layer), and the polyethylene terephthalate film on which the coating was provided was allowed to stand for 10 minutes. Then, the coating was cured by exposing the coating to ultraviolet radiation of 365 nm emitted by a mercury vapor lamp (200 watt/inch) located at 20 centimeters distance from the exposed surface of the coating for 5 seconds to form a fluorescent layer. Thus, an intensifying screen was obtained.

EXAMPLE 2

An intensifying screen was manufactured in the same manner as described in Example 1 except for using a 250μ thick polyethylene terephthalate film having formed thereon a 15μ thick titanium oxide reflective layer as a support and forming a coating on the surface of the reflective layer.

EXAMPLE 3

An intensifying screen was manufactured in the same manner as described in Example 1 except for using a 250μ thick polyethylene terephthalate film having formed thereon a 15μ thick carbon black absorptive layer as a support and forming a coating on the surface of the absorptive layer.

EXAMPLE 4

| | |
|---|---|
| Epoxy acrylate (DICLITE UE-8100, manufactured by Dai Nippon Ink Co., Ltd.) | 70 parts (by weight) |
| Trimethylolpropane triacrylate (manufactured by Nippon Kayaku Co., Ltd.) | 80 parts |
| Benzoin methyl ether | 3 parts |

The above raw materials were mixed to obtain an ultraviolet radiation-curable resin composition. Then, the ultraviolet radiation-curable resin composition thus prepared was applied to the surface of the fluorescent layer of the intensifying screen obtained in Example 1 by means of a knife coater to form a coating having a thickness to produce a 10μ thick cured layer (transparent protective layer) thereon. The coating was cured in the same manner as described in Example 1 to form a transparent protective layer. Thus, an intensifying screen having the transparent protective layer on the fluorescent layer was obtained.

EXAMPLE 5

A coating was formed on a polyethylene terephthalate film in the same manner as described in Example 1, and the polyethylene terephthalate film on which the coating was provided was allowed to stand for 10 minutes. Then, the coating was cured by exposing the coating to ultraviolet radiation of 365 nm emitted by two mercury vapor lamps (200 watt/inch) one located at 20 centimeters distance from the exposed surface of the coating and the other located at 20 centimeters distance from the exposed surface of the polyethylene terephthalate film, for 3 seconds to form a fluorescent layer. Thus, an intensifying screen was obtained.

EXAMPLE 6

| | |
|---|---|
| Polyester acrylate (ARONIX M-6100, manufactured by Toa Gosei Co., Ltd.) | 70 parts (by weight) |
| Trimethylolpropane triacrylate (manufactured by Nippon Kayaku Co., Ltd.) | 80 parts |
| Benzoin methyl ether | 3 parts |
| BaFCl:Eu$^{2+}$ phosphor | 300 parts |

An intensifying screen was obtained in the same manner as described in Example 1 employing the above raw materials.

EXAMPLE 7

| | |
|---|---|
| Polyester acrylate (ARONIX M-6300, manufactured by Toa Gosei Co., Ltd.) | 70 parts (by weight) |
| Trimethylolpropane triacrylate (manufactured by Nippon Kayaku Co., Ltd.) | 80 parts |
| Benzoin methyl ether | 3 parts |
| Gd$_2$O$_2$S:Tb phosphor | 300 parts |

An intensifying screen was obtained in the same manner as described in Example 1 employing the above raw materials.

EXAMPLE 8

| | |
|---|---|
| Epoxy acrylate (DICLITE UE-8100, manufactured by Dai Nippon Ink Co., Ltd.) | 70 parts (by weight) |
| Trimethylolpropane triacrylate (manufactured by Nippon Kayaku Co., Ltd.) | 80 parts |
| Benzoin methyl ether | 3 parts |
| CaWO$_4$ phosphor | 500 parts |
| Methyl isobutyl ketone | 10 parts |

An intensifying screen was obtained in the same manner as described in Example 1 employing the above raw materials except for drying the coating formed for 15 minutes at 70° C. to evaporate the methyl isobutyl ketone (solvent) completely.

EXAMPLE 9

| | |
|---|---|
| Epoxy acrylate (DICLITE UE-8100, manufactured by Dai Nippon Ink Co., Ltd.) | 100 parts (by weight) |
| Trimethylolpropane triacrylate (manufactured by Nippon Kayaku Co., Ltd.) | 50 parts |
| Benzoin methyl ether | 3 parts |
| CaWO$_4$ phosphor | 300 parts |
| Methyl isobutyl ketone | 10 parts |

An intensifying screen was obtained in the same manner as described in Example 8 employing the above raw materials.

EXAMPLE 10

| | |
|---|---|
| Polyester acrylate (ARONIX M-6100, manufactured by Toa Gosei Co., Ltd.) | 100 parts (by weight) |
| Trimethylolpropane triacrylate (manufactured by Nippon Kayaku Co., Ltd.) | 50 parts |
| Benzoin methyl ether | 3 parts |
| BaFCl:Eu$^{3+}$ phosphor | 300 parts |
| Methyl isobutyl ketone | 10 parts |

An intensifying screen was obtained in the sme manner as described in Example 8 employing the above raw materials.

EXAMPLE 11

| | |
|---|---|
| Epoxy acrylate (DICLITE UE-8100, manufactured by Dai Nippon Ink Co., Ltd.) | 70 parts (by weight) |
| Trimethylolpropane triacrylate (manufactured by Nippon Kayaku Co., Ltd.) | 80 parts |
| Benzoin methyl ether | 3 parts |
| CaWO$_4$ phosphor | 300 parts |

The above raw materials were mixed for 24 hours by means of a ball mill, and the mixture obtained was filtrated through a filter fabric of 100 mesh to obtain a dispersion. Then, the dispersion thus prepared was applied to the surface of a release layer provided on a 3 millimeter thick glass plate by means of a knife coater to form a coating having a thickness to produce a 150μ thick cured layer (fluorescent layer), and the glass plate on which the coating was provided was allowed to stand for 10 minutes. Then, the coating was cured by exposing the coating to ultraviolet radiation of 365 nm emitted by two mercury vapor lamps (200 watt/inch) one located at 20 centimeters distance from the exposed surface of the coating and the other located at 20 centimeters distance from the exposed surface of the glass plate, for 3 seconds to form a fluorescent layer. Thereafter, the fluorescent layer was peeled off from the glass plate and bonded to an adhesive layer provided beforehand on a 400μ thick white paper. Thus, an intensifying screen was obtained.

I claim:
1. A process for manufacturing a radiographic intensifying screen comprising steps of
 applying to a surface of a support a dispersion comprising (a) an ultraviolet radiation-curable resin composition which is composed of an unsaturated resin, a polymerizable monomer and a sensitizer, and (b) a radioluminescent phosphor dispersed in said composition (a) to form a coating on said support,
 removing from said coating, ingredients, if present, other than composition (a) or phosphor (b) so that the coating consists essentially of composition (a) and phosphor (b); and then
 curing the coating by exposing said coating to ultraviolet radiation to form a fluorescent layer on said support.

2. A process as defined in claim 1 wherein the weight ratio of said unsaturated resin to said polymerizable monomer is within the range of 1:0.1 to 1:2, and the amount of said sensitizer is within the range of 0.01 to 10 weight % of said ultraviolet radiation-curable resin composition.

3. A process as defined in claim 2 wherein said weight ratio is within the range of 1:0.5 to 1:1.5, and said amount is within the range of 0.5 to 5 weight %.

4. A process as defined in claim 1 wherein the weight ratio of said ultraviolet radiation-curable resin composition to said radioluminescent phosphor is within the range of 1:1 to 1:20.

5. A process as defined in claim 4 wherein said weight ratio is within the range of 3:10 to 1:10.

6. A process as defined in claim 1 wherein the exposed surface of said coating is exposed to said ultraviolet radiation.

7. A process as defined in claim 1 wherein said support is ultraviolet radiation-transmissive, and both surfaces of said coating are exposed to said ultraviolet radiation.

8. A process as defined in claim 1 wherein the source of said ultraviolet radiation is a mercury vapor lamp.

9. A process as defined in claim 8 wherein said mercury vapor lamp emits ultraviolet radiation of 365 nm.

10. A process as defined in claim 1 wherein at least a portion of the wavelength region of light absorption of the sensitizer overlaps at least a portion of the wavelength region of light emission of the radioluminescent phosphor when the latter is excited by ultraviolet radiation.

11. A process as defined in claim 10 wherein said light emission occurs as the phosphor is excited by said ultraviolet radiation during the coating curing step.

12. A process as defined in claims 1 or 10 wherein said overlapping wavelength regions extend from near ultraviolet to 500 nm.

13. A process as defined in claims 1 or 10 wherein said sensitizer absorbs light at least in the wavelength region of 200 to 500 nm while the radioluminescent phosphor at last exhibits light emission in the wavelength region less than about 500 nm when excited by ultraviolet radiation.

14. A process as in claim 1 wherein a solvent is added to said dispersion to facilitate the application of the dispersion to the support and wherein said solvent is remoed from the coating prior to the curing step.

15. A process for manufacturing a radiographic intensifying screen comprising steps of
 applying to a surface of a support a dispersion comprising (a) a first ultraviolet radiation-curable resin composition which is composed of a first unsaturated resin, a first polymerizable monomer and a first sensitizer, and (b) a radioluminescent phosphor dispersed in said first ultraviolet radiation-curable resin composition to form a first coating on said support,
 removing from said first coating, ingredient, if present, other than composition (a) or phosphor (b) so that the first coating consists essentially of composition (a) and phosphor (b); and then
 curing said first coating by exposing said first coating to first ultraviolet radiation to form a fluorescent layer on said support,
 applying to a surface of said fluorescent layer a second ultraviolet radiation-curable resin composition which is composed of a second unsaturated resin, a second polymerizable monomer and a second sensitizer to form a second coating on said fluorescent layer, and
 removing from said second coating, ingredients, if present, other than said second composition so that the second coating consists essentially of the second composition; and then
 curing said second coating by exposing said second coating to second ultraviolet radiation to form a transparent protective layer.

16. A process as defined in claim 15 wherein the weight ratio of said first unsaturated resin to said first polymerizable monomer and the weight ratio of said second unsaturated resin to said second polymerizable monomer are both within the range of 1:0.1 to 1:2, and the amount of said first sensitizer and the amount of said second sensitizer are both within the range of 0.01 to 10 weight % of said first ultraviolet radiation-curable resin composition and of said second ultraviolet radiation-curable resin composition, respectively.

17. A process as defined in claim 16 wherein the range of said weight ratio is 1:0.5 to 1:1.5, and the range of said amount is 0.5 to 5 weight %.

18. A process as defined in claim 15 wherein the weight ratio of said first ultraviolet radiation-curable resin composition to said radioluminescent phosphor is within the range of 1:1 to 1:20.

19. A process as defined in claim 18 wherein said weight ratio is within the range of 3:10 to 1:10.

20. A process as defined in claim 15 wherein the exposed surface of said first coating is exposed to said first ultraviolet radiation.

21. A process as defined in claim 15 wherein said support is ultraviolet radiation-transmissive, and both surfaces of said coating are exposed to said first ultraviolet radiation.

22. A process as defined in claim 15 wherein the source of said first ultraviolet radiation and the source of said second ultraviolet radiation are both mercury vapor lamps.

23. A process as defined in claim 17 wherein said mercury vapor lamp emits ultraviolet radiation of 365 nm.

24. A process as defined in claim 15 wherein at least a portion of the wavelength regions of light absorption of the first and second sensitizers respectively overlaps at least a portion of the wavelength regions of light emission of the first and second radioluminescent phosphors when the latter are excited by ultraviolet radiation.

25. A process as defined in claim 24 wherein said light emissions occur as the phosphors are excited by said ultraviolet radiation during their respective coating curing steps.

26. A process as defined in claims 15 or 24 wherein the respective overlapping wavelength regions extend from near ultraviolet to 500 nm.

27. A process as defined in claims 15 or 24 wherein said first and second sensitizers absorb light at least in the wavelength region of 200 to 500 nm while the first and second radioluminescent phosphors at least exhibit light emission in the wavelength region less than about 500 nm when excited by ultraviolet radiation.

28. A process as in claim 15 wherein a first solvent is added to said dispersion to facilitate the application of the dispersion to the support and wherein said first solvent is removed from the first coating prior to the first curing step.

29. A process for manufacturing a radiographic intensifying screen comprising steps of
applying to a surface of a flat plate a dispersion comprising (a) an ultraviolet radiation-curable resin composition which is composed of an unsaturated resin, a polymerizable monomer and a sensitizer, and (b) a radioluminescent phosphor dispersed in said composition (a) to form a coating on said flat plate,
removing from said coating, ingredients, if present, other than composition (a) or phosphor (b) so that the coating consists essentially of composition (a) and phosphor (b); and then
curing said coating by exposing said coating to ultraviolet radiation to form a fluorescent layer on said flat plate,
peeling off said fluorescent layer from said flat plate, and
bonding said fluorescent layer to a surface of a support.

30. A process as defined in claim 29 wherein the weigh ratio of said unsaturated resin to said polymerizable monomer is within the range of 1:0.1 to 1:2, and the amount of said sensitizer is within the range of 0.01 to 10 weight % of said ultraviolet radiation-curable resin composition.

31. A process as defined in claim 30 wherein said weight ratio is within the range of 1:0.5 to 1:1.5, and said amount is within the range of 0.5 to 5 weight %.

32. A process as defined in claim 29 wherein the weight ratio of said ultraviolet radiation-curable resin composition to said radioluminescent phosphor is within the range of 1:1 to 1:20.

33. A process as defined in claim 32 wherein said weight ratio is within the range of 3:10 to 1:10.

34. A process as defined in claim 29 wherein the exposed surface of said coating is exposed to said ultraviolet radiation.

35. A process as defined in claim 29 wherein said flat plate is ultraviolet radiation-transmissive, and both surfaces of said coating are exposed to said ultraviolet radiation.

36. A process as defined in claim 29 wherein the source of said ultraviolet radiation is a mercury vapor lamp.

37. A process as defined in claim 36 wherein said mercury vapor lamp emits ultraviolet radiation of 365 nm.

38. A process as defined in claim 29 wherein at least a portion of the wavelength region of light absorption of the sensitizer overlaps at least a portion of the wavelength region of light emission of the radioluminescent phosphor when the latter is excited by ultraviolet radiation.

39. A process as defined in claim 38 wherein said light emission occurs as the phosphor is excited by said ultraviolet radiation during the coating curing step.

40. A process as defined in claims 29 or 38 wherein said overlapping wavelength regions extend from near ultraviolet to 500 nm.

41. A process as defined in claims 29 or 38 wherein said sensitizer absorbs light at least in the wavelength region of 200 to 500 nm while the radioluminescent phosphor at least exhibits light emission in the wavelength region less than about 500 nm when excited by ultraviolet radiation.

42. A process as in claim 29 wherein a solvent is added to said dispersion to facilitate the application of the dispersion to the plate and wherein said solvent is removed from the coating prior to the curing step.

* * * * *